United States Patent
Ring et al.

(10) Patent No.: US 7,125,786 B2
(45) Date of Patent: Oct. 24, 2006

(54) METHOD OF FORMING VIAS IN SILICON CARBIDE AND RESULTING DEVICES AND CIRCUITS

(75) Inventors: Zoltan Ring, Durham, NC (US); Scott Sheppard, Chapel Hill, NC (US); Helmut Hagleitner, Zebulon, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/067,543

(22) Filed: Feb. 25, 2005

(65) Prior Publication Data
US 2006/0065910 A1    Mar. 30, 2006

Related U.S. Application Data

(63) Continuation-in-part of application No. 10/007,431, filed on Nov. 8, 2001, now Pat. No. 6,649,497, which is a continuation of application No. 09/546,821, filed on Apr. 11, 2000, now Pat. No. 6,475,889.

(51) Int. Cl.
*H01L 21/44* (2006.01)

(52) U.S. Cl. ............ 438/571; 438/716; 438/707; 438/712; 438/730; 438/740; 257/E21.603; 257/E31.049; 257/E29.104; 257/E21.182

(58) Field of Classification Search ............ 438/571, 438/716, 406, 706, 707, 712, 729, 730, 740; 257/E21.603, E31.049, E29.104, E21.182
See application file for complete search history.

(56) References Cited

U.S. PATENT DOCUMENTS

| | | | |
|---|---|---|---|
| 4,771,017 A | 9/1988 | Tobin et al. | |
| 4,866,507 A | 9/1989 | Jacobs et al. | |
| 4,874,500 A | 10/1989 | Madou et al. | |
| 4,951,014 A | 8/1990 | Wohlert et al. | |
| 4,966,862 A | 10/1990 | Edmond | |

(Continued)

FOREIGN PATENT DOCUMENTS

EP    0663693 A    7/1995

(Continued)

OTHER PUBLICATIONS

Ralph E. Williams, Gallium Arsenide Processing Techniques, 1984, pp. 346-351, Artech House, Inc., Dedham, MA.

(Continued)

*Primary Examiner*—Michelle Estrada
*Assistant Examiner*—Nicholas J. Tobergte
(74) *Attorney, Agent, or Firm*—Summa, Allan & Additon, P.A.

(57) ABSTRACT

A method of fabricating an integrated circuit on a silicon carbide substrate is disclosed that eliminates wire bonding that can otherwise cause undesired inductance. The method includes fabricating a semiconductor device in epitaxial layers on a surface of a silicon carbide substrate and with at least one metal contact for the device on the uppermost surface of the epitaxial layer. The opposite surface of the substrate is then ground and polished until it is substantially transparent. The method then includes masking the polished surface of the silicon carbide substrate to define a predetermined location for at least one via that is opposite the device metal contact on the uppermost surface of the epitaxial layer and etching the desired via in steps. The first etching step etches through the silicon carbide substrate at the desired masked location until the etch reaches the epitaxial layer. The second etching step etches through the epitaxial layer to the device contacts. Finally, metallizing the via provides an electrical path from the first surface of the substrate to the metal contact and to the device on the second surface of the substrate.

19 Claims, 5 Drawing Sheets

U.S. PATENT DOCUMENTS

| | | | |
|---|---|---|---|
| 5,185,292 | A | 2/1993 | VanVonno et al. |
| 5,187,547 | A | 2/1993 | Niina et al. |
| 5,264,713 | A | 11/1993 | Palmour |
| 5,279,888 | A | 1/1994 | Nii |
| 5,343,071 | A | 8/1994 | Kazior et al. |
| 5,406,122 | A | 4/1995 | Wong et al. |
| 5,449,953 | A | 9/1995 | Nathanson et al. |
| 5,539,217 | A | 7/1996 | Edmond et al. |
| 5,662,770 | A | 9/1997 | Donohoe |
| 5,672,546 | A | 9/1997 | Wojnarowski |
| 5,807,783 | A | 9/1998 | Gaul et al. |
| 5,914,508 | A | 6/1999 | Varmazis et al. |
| 5,935,733 | A | 8/1999 | Scott et al. |
| 5,939,732 | A | 8/1999 | Kurtz et al. |
| 5,963,818 | A | 10/1999 | Kao et al. |
| 6,020,600 | A | 2/2000 | Miyajima et al. |
| 6,087,719 | A | 7/2000 | Tsunashima |
| 6,114,768 | A | 9/2000 | Gaul et al. |
| 6,128,363 | A | 10/2000 | Shoki et al. |
| 6,221,537 | B1 | 4/2001 | Thompson et al. |
| 6,225,651 | B1 | 5/2001 | Billon |
| 6,297,100 | B1 | 10/2001 | Kumar et al. |
| 6,316,826 | B1 | 11/2001 | Yamamoto et al. |
| 6,515,303 | B1 | 2/2003 | Ring |
| 2001/0023964 | A1 | 9/2001 | Yifeng Wu et al. |
| 2003/0003724 | A1 | 1/2003 | Uchiyama et al. |
| 2004/0241970 | A1 | 12/2004 | Zoltan Ring |

FOREIGN PATENT DOCUMENTS

| | | |
|---|---|---|
| EP | 0887854 A1 | 12/1998 |
| JP | 410229074 A | 8/1998 |

OTHER PUBLICATIONS

J. J. Wang, et al., Low Bias Dry Etching of SiC and SiCN in ICP NF3 Discharges, Mat Res. Soc. Symp. Proc., 1998, vol. 512, Materials Research Society.

J. R. Flemish and K. Xie, Profile and Morphology Control during Etching of SiC Using Electron Cyclotron Resonant Plasmas, J. Electrochem Soc., Aug. 1996, pp. 2620-2623, vol. 143, No. 8, The Electrochem Society, Inc.

G. McDaniel, et al., Comparison of dry etch chemistries for SiC, J. Vac. Sci. Technol., May/Jun. 1997, pp. 885-889, A 15(3), American Vacuum Society.

J. J. Wang, et al., Low Damage, Highly Anisotropic Dry Etching of SiC, IEEE, 1998, pp. 10-14.

J. J. Wang, et al., Inductively coupled plasma etching of bulk 6H—SiC and thin-film SiCN in NF3 chemistries, J. Vac. Sci. Technol., Jul./Aug. 1998, pp. 2204-2209, A 16(4).

Lihui Cao, et al., Etching of SiC Using Inductively Coupled Plasma, J. Electrochem Soc., Oct. 1998, pp. 3609-3612, vol. 145, No. 10, The Electrochemical Society, Inc.

J. Hong, et al., Plasma Chemistries for High Density Plasma Etching of SiC, Journal of Electronic Materials, 1999, pp. 196-201, vol. 28, No. 3.

P. Leerungnawarat, et al., Via-hole etching for SiC, J. Vac. Sci. Technol., Sep./Oct. 1999, pp. 2050-2054, B 17(5), American Vacuum Society.

Cho, et al.; High density plasma via hole etching in SiC; 47th International Symposium of the American Vacuum Society, Boston, MA, vol. 19, No. 4, pt. 1-2, pp. 1878-1881; J. Vac. Sci. Technol., Jul.-Aug. 2001, AIP for American Vacuum Soc., USA.

P. Chabert, et al.; High rate etching of 4H—SiC using a SF/sub 6//0/sub2/helicon plasma; Applied Physics Letters, Apr. 17, 2000, AIP, USA, vol. 76, No. 16, pp. 2310-2312.

METHOD OF FORMING VIAS IN SILICON CARBIDE AND RESULTING DEVICES AND CIRCUITS

This application is a continuation-in-part of Ser. No. 10/007,431 filed Nov. 8, 2001, which is a continuation of Ser. No. 09/546,821 filed Apr. 11, 2000, now U.S. Pat. No. 6,475,889.

STATEMENT REGARDING FEDERALLY SPONSORED RESEARCH AND DEVELOPMENT

This invention was developed under DARPA Contract No. F33615-96-C-1967. The government may have certain rights in this invention.

BACKGROUND

The present invention relates to integrated circuits formed in semiconductor materials and in particular relates to methods for forming via openings in semiconductor substrates, Group III nitride epitaxial layers, and the resulting structures. More particularly, the invention relates to the use of such vias to form monolithic microwave integrated circuits (MMICs) in silicon carbide (SiC).

The present invention relates to the manufacture of via openings ("vias") in integrated circuits (ICs), and in particular relates to a method of forming such vias in devices on a silicon carbide substrate in order to take advantage of silicon carbide's electronic, thermal, and mechanical properties in the manufacture and use of monolithic microwave integrated circuits.

MMICs

In its most basic sense, a monolithic microwave integrated circuit is an integrated circuit; i.e., a circuit formed of a plurality of devices; in which all of the circuit components are manufactured on top of a single semiconductor substrate, and which is designed to operate at microwave frequencies. As is generally the case with integrated circuits, the advantage of placing the device and circuit components on a single substrate is one of saving space. Smaller circuit size offers numerous advantages for electronic circuits and the end-use devices that incorporate such circuits. In general, the end-use devices can be smaller while offering a given set of functions, or more circuits and functions can be added to devices of particular sizes, or both advantages can be combined as desired. From an electronic standpoint, integrated circuits help reduce or eliminate problems such as parasitic capacitance loss that can arise when discrete devices are wire-bonded to one another to form circuits. These advantages can help integrated circuits operate at improved bandwidths as compared to circuits that are "wired" together from discrete components.

Wireless communications systems represent one area of recent and rapid growth in integrated circuits and related commercial technology. Such systems are exemplified, although not limited to, cellular radio communication systems. One estimate predicts that the number of wireless subscribers for such phones will continue to grow worldwide and will exceed 450 million users in the immediate future. The growth of such technologies will require that devices are smaller, more powerful and easier to manufacture. These desired advantages apply to base, relay and switching stations as well as to end user devices such as the cellular phones themselves.

As recognized by those of ordinary skill in this art, many wireless devices, and in particular cellular phone systems, operate in the microwave frequencies of the electromagnetic spectrum. Although the term "microwave" is somewhat arbitrary, and the boundaries between various classifications or frequencies are likewise arbitrary, an exemplary choice for the microwave frequencies would include wavelengths of between about 3,000 and 300,000 microns ($\mu$), which corresponds to frequencies of between about 1 and 100 gigahertz (GHz).

As further known by those of ordinary skill in this art, these particular frequencies are most conveniently produced or supported by certain semiconductor materials. For example, although discrete (i.e., individual) silicon (Si) based devices can operate at microwave frequencies, silicon-based integrated circuits suffer from lower electron mobility and are generally disfavored for frequencies above about 3–4 GHz. Silicon's inherent conductivity also limits the gain that can be delivered at high frequencies.

Accordingly, devices that operate successfully on a commercial basis in the microwave frequencies are preferably formed of other materials, of which gallium arsenide (GaAs) is presently a material of choice. Gallium arsenide offers certain advantages for microwave circuits and monolithic microwave integrated circuits, including a higher electron mobility than silicon and a greater insulating quality.

Because of the frequency requirements for microwave devices and microwave communications, silicon carbide is a favorable candidate material for such devices and circuits. Silicon carbide offers a number of advantages for all types of electronic devices, and offers particular advantages for microwave frequency devices and monolithic microwave integrated circuits. Silicon carbide has an extremely wide band gap (e.g., 2.996 electron volts (eV) for alpha SiC at 300K as compared to 1.12 eV for Si and 1.42 for GaAs), has a high electron mobility, is physically very hard, and has outstanding thermal stability, particularly as compared to other semiconductor materials. For example, silicon has a melting point of 1415° C. (GaAs is 1238° C.), while silicon carbide typically will not begin to disassociate in significant amounts until temperatures reach at least about 2000° C. As another factor, silicon carbide can be fashioned either as a semiconducting material or a semi-insulating material. Because insulating or semi-insulating substrates are often required for MMICs, this is a particularly advantageous aspect of silicon carbide.

Advances in semiconductor electronics have increased the availability of wide-band gap materials, such as silicon carbide (SiC) and the Group III nitrides (e.g. GaN, AlGaN and InGaN). The potential for producing transistors operating at high frequencies, including the microwave band, has therefore become a commercial reality. Such higher frequency devices are extremely useful in a number of applications, some of the more familiar of which are power amplifiers, wireless transceivers such as cellular telephones, and similar devices. See generally, commonly assigned U.S. Pat. No. 6,507,046.

The wide bandgap characteristics of silicon carbide and the Group III nitrides enable device manufacturers to optimize the performance of semiconductor electronics at frequencies that traditional materials can not withstand. The high frequency capabilities of these wide bandgap materials present opportunities for development of high frequency, high power semiconductor electronic devices on a scale that will meet the needs of a growing industry.

Wide band gap epitaxial layers of significant interest include the Group III nitrides that are capable of withstanding operation at microwave frequencies. Wu and Zhang explain the operation of these wide bandgap epitaxial layers in international patent application WO 01/57929, assigned to Cree Lighting Company, a wholly owned subsidiary of the assignee herein. Of particular importance to Wu and Zhang are high electron mobility field effect transistors, known as HEMTs. HEMTs, as shown in WO 01/57929, comprise an upper epitaxial layer of semiconductor material on an insulating layer. Source, drain and gate contacts are fabricated on the upper epitaxial layer. The HEMT takes advantage of the physical phenomenon that occurs when two chosen materials of different band gaps are placed in contact with one another in an electronic device. The upper epitaxial layer in an HEMT typically has a wider bandgap than the insulating layer underneath it, and a two dimensional electron gas (2DEG) forms at the junction between the upper epitaxial layer and the insulating layer. The 2DEG formed at this junction has a high concentration of electrons which provide an increased device transconductance. The 2DEG serves as the channel of an HEMT. This channel is open and closed depending on the bias of the signal applied to the gate electrode. See WO 01/57929.

HEMTs are useful in applications that require high power output from a high frequency input signal. HEMT devices can generate large amounts of power because they have high breakdown fields, wide bandgaps (3.36 eV for GaN at room temperature), large conduction band offset, and high saturated electron drift velocity. The same size GaN amplifier can produce up to ten times the power of a GaAs amplifier operating at the same frequency. See WO 01/57929.

The 2DEG of a high electron mobility transistor is essentially an electron rich upper portion of the undoped, smaller bandgap material under the wider bandgap epitaxial layer. The 2DEG can contain a very high sheet electron concentration on the order of $10^{12}$ to $10^{13}$ carriers/cm$^2$. See commonly assigned U.S. Pat. No. 6,316,793. Electrons from the wider-bandgap semiconductor transfer to the 2DEG, allowing a high electron mobility in this region. Id. A major portion of the electrons in the 2DEG is attributed to pseudomorphic strain in the AlGaN; see, e.g., P. M. Asbeck et al., Electronics Letters, Vol. 33, No. 14, pp. 1230–1231 (1997); and E. T. Yu et al., Applied Physics Letters, Vol. 71, No. 19, pp. 2794–2796 (1997).

High power semiconducting devices, such as the above described HEMT, operate in a microwave frequency range and are used for RF communication networks and radar applications. The devices offer the potential to greatly reduce the complexity and thus the cost of cellular phone base station transmitters. Other potential applications for high power microwave semiconductor devices include replacing the relatively costly tubes and transformers in conventional microwave ovens, increasing the lifetime of satellite transmitters, and improving the efficiency of personal communication system base station transmitters. See commonly assigned U.S. Pat. No. 6,316,793.

Accordingly, the need exists for continued improvement in high frequency, high power semiconductor based microwave devices. One significant improvement described in detail herein is the development of a means for fabricating HEMT devices as part of a monolithic microwave integrated circuit (MMIC).

MMICs are fabricated with backside metallic ground planes, to which contacts must be made from various points in the NMIC, for example at transmission line terminations. Traditionally, this has been accomplished by wire bonds. Although wire bonding techniques can be used for other devices that operate at other frequencies, they are disadvantageous at microwave frequencies in silicon carbide devices. In particular, wires tend to cause undesired inductance at the microwave frequencies at which silicon carbide devices are capable of operating. For frequencies above 10 GHz, wire bonding simply must be avoided altogether. Accordingly, such wire bonding is desirably—and sometimes necessarily—avoided in silicon carbide-based MMICs.

The use of conductive vias (i.e., via openings filled or coated with metal) to replace wire bonds is a potential solution to this problem. To date, however, opening vias in silicon carbide has been rather difficult because of its extremely robust physical characteristics, which, as noted above, are generally advantageous for most other purposes. MMICs that incorporate HEMTs and other semiconductor devices require the additional step of opening vias through the Group III nitride epitaxial layers on the silicon carbide substrate without disrupting device integrity. The invention described herein achieves the opening of conductive vias through the silicon carbide substrate and through the Group III nitride epilayers by utilizing etching techniques tailored to the chemical composition of the substrate and the epilayers.

Etching and Etchants

Etching is a process that removes material (e.g., a thin film on a substrate or the substrate itself) by chemical or physical reaction or both. There are two main categories of etching: wet and dry. In wet etching, chemical solutions are used to etch, dry etching uses a plasma. Silicon carbide does not lend itself rapidly to wet etching because of SiC's stability and high bond strength. Consequently, dry etching is most often used to etch silicon carbide.

In dry etching, a plasma discharge is created by transferring energy (typically electromagnetic radiation in the RF or microwave frequencies) into a low-pressure gas. The gas is selected so that its plasma-state etches the substrate material. Various fluorine-containing compounds (e.g., $CF_4$, $SF_6$, $C_4F_8$) are typically used to etch silicon carbide and different plasma reactor systems may also use gas additives such as oxygen ($O_2$), hydrogen ($H_2$), or argon (Ar). The plasma contains gas molecules and their dissociated fragments: electrons, ions, and neutral radicals. The neutral radicals play a part in etching by chemically reacting with the material to be removed while the positive ions traveling towards a negatively charged substrate assist the etching by physical bombardment.

Reactive ion etching (RIE) systems typically use one RF generator. The RF power is fed into one electrode (the "chuck," on which the wafers are placed), and a discharge results between this electrode and the grounded electrode. In such systems, the capacitive nature of RF energy coupling limits the density of the plasma, which in turn leads to lower etch rates of silicon carbide. In RIE systems, plasma density and ion energy are coupled and cannot be independently controlled. When RF input power increases, plasma density and ion energy both increase. As a result, RIE systems cannot produce the type of high density and low energy plasma favorable for etching vias in silicon carbide.

In inductively coupled plasma (ICP) systems, two RF generators are used. One feeds RF power to a coil wrapped around the non-conductive discharge chamber. The second feeds power to the electrode (chuck) on which the wafers are placed. In such systems, the inductive nature of the RF energy coupling increases the efficiency of energy coupling and hence the density of the plasma. Additionally, the plasma density can be independently controlled by the coil RF power, while the ion energy can be independently controlled by the chuck RF power. Thus, ICP systems can produce the high density and low energy plasmas that are favorable for etching vias in silicon carbide.

Etches are performed on selected areas of the wafer by masking areas of the wafer that do not need to be etched. The ratio of the etch rate of the substrate (the material to be etched) to the etch rate of the mask material is referred to as the "selectivity" of the etch. For deep etches and faithful pattern transfer, high selectivity etches are desired.

Etches generally proceed in both the vertical and horizontal directions. The vertical direction can be measured as etch depth in the unmasked areas, while the horizontal direction can be measured as undercut under the mask areas. The degree of anisotropy is expressed by how much the ratio of the horizontal etch rate to the vertical etch rate deviates from unity. When the etch rate in the vertical direction is much greater than the rate in the horizontal direction, the etch is called anisotropic. The reverse characteristic is referred to as being isotropic. Because of silicon carbide's high bond strength, it does not etch without ion bombardment in the horizontal direction. As a result, dry etches of silicon carbide are generally anisotropic.

In contrast, etches of silicon (Si) in ICP systems are generally isotropic. This results from silicon's low bond strength, because of which it readily etches in the horizontal direction. Silicon etches can be made anisotropic by using the Bosch process that alternates a deposition step for sidewall protection and an etch step.

The use of ICP (inductively coupled plasma) and ECR (electron cyclotron resonance) sources for SiC etching have resulted in higher etch rates as compared to RIE (reactive ion etch). Both ICP and ECR systems use lower operating pressure (e.g., 1 to 20 milliTorr), higher plasma density ($10^{11}$ to $10^{12}$ cm$^{-3}$) and lower ion energies compared to RIE systems. The combination of these parameters result in high etch rate of SiC and minimal erosion of the etch mask. RIE systems use higher pressure (10 to 300 milliTorr) lower plasma density ($10^{10}$ cm$^{-3}$) and higher ion energies to break SiC bonds and etch; however, the detrimental effects of high ion energies and low plasma density include mask erosion and lower etch rate.

As reported in the scientific literature by McDaniel et al., *Comparison of Dry Etch Chemistries for SiC*, J. Vac. Sci. Technol. A., 15(3), 885 (1997), scientists have been successful in etching SiC using an electron cyclotron resonance (ECR) plasma. Scientific studies have determined that higher ion density ECR discharges of $CF_4/O_2$ or $SF_6/O_2$ results in a much higher etch rate than RIE. In contrast with RIE, there have been no observed benefits to adding oxygen to either $NF_3$ or $SF_6$ during ECR etching.

Previous attempts at using plasma chemistries for high-density plasma etching of SiC include the use of chlorine ($Cl_2$), bromine ($Br_2$), or iodine ($I_2$)-based gases. However, the use of fluorine-based gas has produced much higher etch rates. For example, Hong et al., *Plasma Chemistries for High Density Plasma Etching of SiC*, J. Electronic Materials, Vol. 28, No. 3, 196 (1999), discusses dry etching of 6H—SiC using a variety of plasma chemistries which include sulfur hexafluoride ($SF_6$), chlorine ($Cl_2$), iodine chloride (ICl), and iodine bromide (IBr) in high ion density plasma tools (i.e., ECR and ICP). These efforts have achieved etch rates of around 0.45 µm/minute (4500 Å/minute) with $SF_6$ plasmas. Alternatively, $Cl_2$, ICl, and IBr-based chemistries in ECR and ICP sources resulted in lower rates of 0.08 µm/minute (800 Å/minute). It was found that fluorine-based plasma chemistries produced the most rapid, and hence most desirable, etch rates for SiC under high-density plasma conditions. Unfortunately, the fluorine-based chemistries displayed a poor selectivity for SiC with respect to photoresist masks.

Wang et al. reported in *Inductively Coupled Plasma Etching of Bulk 6H—SiC and Thin-film SiCN in NF3 Chemistries*, J. Vac. Sci. Technol. A, 16(4) (1998), the etching characteristics of 6H p+ and n+ SiC and thin-film $SiC_{0.5}N_{0.5}$ in inductively coupled plasma $NF_3/O_2$ and $NF_3/Ar$ discharges wherein etch rates of 0.35 µ/minute (3,500 Å/minute) were achieved.

In further scientific literature, Cao et al., *Etching of SiC Using Inductively Coupled Plasma*, J. Electrochem. Soc., Vol. 145, No. 10 (1998), discusses plasma etching in an ECR plasma using $CF_4$ and $O_2$ gas at flow rates of 20 standard cubic centimeters per minute (sccm) and 9 sccm, respectively, attained an etch rate in SiC of about 0.05 µm/minute (500 Å/minute). The process resulted in a 14 µm deep trench having a smooth bottom surface. Further, the low chamber pressure (i.e., 7 mTorr) minimized micromasking effects during the deep etch trenching. During the Cao et al. investigation, substrate bias was maintained at 10 V and the coil power was maintained at 700 W.

In view of the technologies discussed above, a primary objective of SiC via etching is finding a process in which SiC is etched at a reasonable rate while erosion of the etch mask is kept to a minimum. The factors affecting this objective are the choice of mask material, plasma chemistry, plasma density, and ion energy. A secondary objective when etching vias in SiC is obtaining smooth etch surfaces.

Therefore there is a need for a process in which SiC may be etched at a reasonably rapid rate while erosion of the etch mask is minimized.

There is also a need for a method for etching a via in SiC of sufficient depth and at a reasonable rate which results in a smooth surface at the bottom of the via trench.

Another need is for an etching method that efficiently etches Group III nitride epilayers without etching the contacts on a semiconductor device or any exposed silicon carbide.

A further need exists for a technique that successfully incorporates the use of appropriate vias in semi-conducting silicon carbide substrates to facilitate the manufacture of silicon carbide based MMICS and the end-use devices that can be formed with the silicon carbide-based MMICS.

OBJECT AND SUMMARY OF THE INVENTION

Therefore, it is an object of the present invention to provide a method of etching vias in and entirely through silicon carbide substrates and Group III nitride epitaxial layers, in a manner that favorably differentiates between the silicon carbide, the Group III nitrides, the masking material, and the contacts of a semiconductor device.

The invention meets this object with a method of etching a via through a semiconductor device formed in epitaxial layers on a silicon carbide substrate that has first and second surfaces on opposite sides of the substrate. The epitaxial layers comprise Group III nitride semiconductor material on the second surface of the silicon carbide substrate with respective platinum contacts defining the source, gate, and drain regions of the device therein. The invention comprises a method of etching a via through the silicon carbide substrate with a first etchant that removes the silicon carbide but stops etching at the epitaxial layer on the substrate. A second etchant then removes the epitaxial layers and stops etching upon reaching the platinum contacts therein. The etching steps follow a masking pattern that results in a via extending from the bottom, first surface of the silicon carbide substrate to a respective source, drain, or gate contact. Metallizing the respective vias results in a conductive pathway through the substrate and epitaxial layers to the contacts and eliminates the need for connecting the contacts to external circuitry by wire bonding.

In another aspect, the invention comprises a circuit precursor comprising a silicon carbide substrate having respective first and second surfaces, at least one Group III nitride epitaxial layer in which a semiconductor device is formed, and a via extending entirely through the silicon carbide substrate and stopping at the epitaxial layers. Another precursor has at least one via that extends from the first surface of the substrate all the way through the substrate, the epitaxial layers, and stopping at the source, gate, and drain contacts.

These and other objects and advantages of the invention, and the manner in which the same are accomplished, will be more fully understood when taken in conjunction with the detailed description and drawings in which:

DETAILED DESCRIPTION OF THE PREFERRED EMBODIMENTS

In a first aspect, the invention is a method of forming vias in particular materials—preferably, silicon carbide and Group III nitrides—that enables integrated circuits, and particularly monolithic microwave integrated circuits, to be formed on silicon carbide substrates with epitaxial layers on the substrate. The invention allows the devices to be connected to external circuitry in a manner that reduces the inductance problems that are characteristic of such MMICS when wire bonding is used to form electrical contacts for high frequency devices and circuits.

FIGS. 1 through 11 illustrate in sequential fashion the basic steps of the method aspects of the present invention. These will be described somewhat generally, following which particular experimental details will be set forth. Because much of the background of MMICs and their function is well understood in this art, these will not be described in particular detail other than as necessary to highlight the invention. In the same manner, certain process steps are generally well understood so that where appropriate, these will be simply named rather than described in detail. The novel and non-obvious features of the invention, however, are set forth herein in sufficient detail to provide those referring to the specification with the ability to carry out the invention successfully and without undue experimentation.

Figure 1:
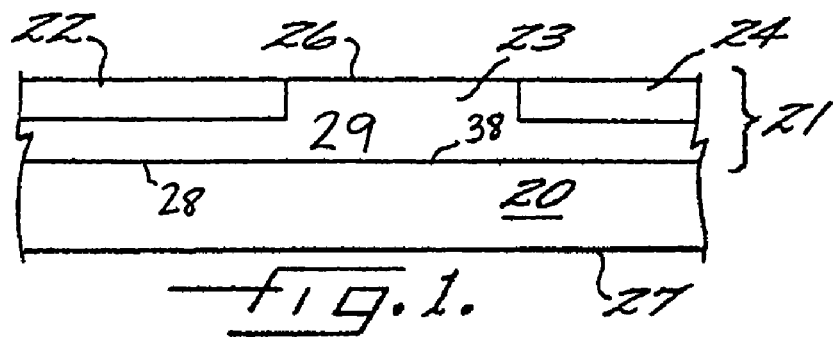
FIGS. 1 through 13 are cross-sectional diagrams illustrating the method of forming a via through a silicon carbide substrate to a device in accordance with the present invention.

FIG. 1 is a cross sectional view of a silicon carbide substrate 20 with a semiconductor device fabricated thereon as indicated by the brackets 21. The device portion includes at least one epitaxial layer 29 on the second surface 28 of the silicon carbide substrate. Although FIG. 1 shows one epitaxial layer 29, the invention described herein applies equally to devices formed in a plurality of epitaxial layers on a silicon carbide substrate. As stated above, the purpose of the present invention is to form a via through the SiC substrate 20 and the epitaxial layer 29, and to use the via to provide an electrical path through the substrate 20 and to a contact 25. For descriptive purposes, FIGS. 1 through 11 illustrate a single via to one contact of a single device. It will nevertheless be understood that the method of the invention, and the resulting structure, are more typically applied to forming numerous vias to numerous devices that form a circuit. In particular, the method is particularly adept for forming conductive vias to the source 22, gate 23, and drain 24 regions of transistors formed in silicon carbide. Certain of the method steps of the invention are, however, most clearly set forth by simplifying the illustrations.

Accordingly, FIG. 1 is meant to illustrate in broad fashion a silicon carbide substrate 20 with a semiconductor device fabricated thereon as indicated by the brackets 21. Representative semiconductor devices include metal-semiconductor field-effect transistors (MESFETs) or high electron mobility transistors (HEMTs) with appropriate source 22, gate 23, and drain 24 regions. In preferred embodiments, particularly for microwave frequency devices, the source 22, gate 23, and drain 24 regions are all formed in a wide band gap material such as silicon carbide, or certain of the Group III nitrides such as aluminum nitride (AlN), gallium nitride (GaN), and related binary, ternary, and tertiary Group III nitride compounds such as AlGaN and InAlGaN. The invention, therefore, encompasses devices that include a plurality of wide band-gap epitaxial layers on a silicon carbide substrate.

The device 21 is formed on a silicon carbide substrate 20 that has a first surface 27 and a second surfaces 28.

Figure 2:
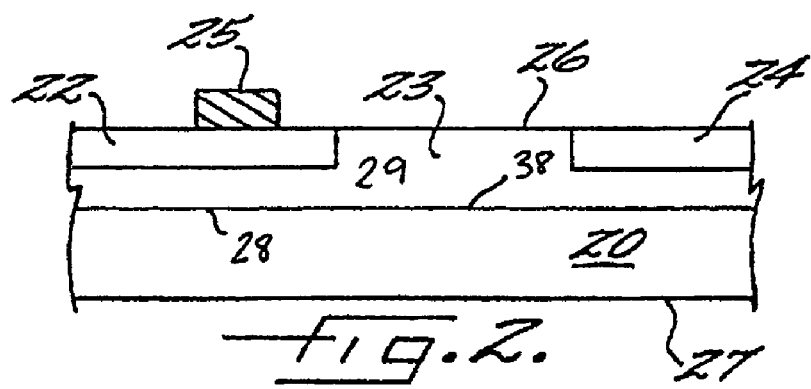

FIG. 2 illustrates the same substrate 20 and corresponding device 21 as FIG. 1, but with a conductive contact 25 in place on the uppermost surface 26 of the epitaxial layer. Those familiar with devices such as MESFETS and HEMTs will immediately recognize that an exemplary device may also include a contact to the gate region 23 and another to the drain region 24. As just noted, however, such contacts are not shown in FIGS. 1–11 for the purpose of simplifying the presentation of the relevant information. Accordingly, FIG. 2 simply shows the conductive contact 25 to the source region 22 of the illustrated device. It will be understood that when the device is formed entirely in a single portion of silicon carbide, the entire portion can be considered the substrate 20.

The conductive contact 25 of the invention herein is preferably formed of platinum. Conventional metals may be used for any of the contacts in a particular embodiment.

Alternatively, and without departing in any manner from the invention, the substrate can also include one or more epitaxial layers ("epilayers") in which the device portion 21 is formed. In such embodiments, the surface 26 would refer to the uppermost surface (in the orientation of FIGS. 1–4) of the epitaxial layer. Those familiar with the growth of semiconductor materials, and particularly the growth of silicon carbide, will recognize that the use of a substrate and an epitaxial layer (or layers) even though made of the same material, provides a method of (in most circumstances) gaining an improved crystal lattice in the epitaxial layers (epilayers) as compared to the substrate.

The fabrication of epilayers on a substrate is well understood in the art. The invention herein includes at least one and preferably a plurality of epitaxial layers made of semiconductor material other than silicon carbide. Group III nitride epilayers on a silicon carbide substrate are especially advantageous. The Group III nitride epilayers provide a wide band gap material in which a semiconductor device capable of operating at microwave frequencies may be formed. Epitaxial layers of particular interest include layers of gallium nitride for forming an HEMT or a MESFET therein. Other Group III nitride layers are particularly suitable for forming HEMTs therein. These other epitaxial layers include layers of InGaN, layers of InAlGaN, a combination of epitaxial layers made of AlGaN and GaN, and a combination of layers made of AlGaN, AlN, and GaN for forming HEMTs therein. The epilayers include a lower surface 29 in contact with the second surface 28 of a silicon carbide substrate 20 and an uppermost surface 26 for forming device contacts thereon.

The Group III nitride semiconductor materials are especially advantageous for forming the channel region of a MESFET or an HEMT. An HEMT according to the invention herein includes a Group III nitride semiconductor material forming a barrier layer on a Group III nitride semiconductor channel layer as shown in HEMT 50 of FIG. 12. The barrier layer 54 of the HEMT 50 has a bandgap energy that is greater than the bandgap energy of the channel layer 52 so that the junction of the barrier layer 54 and the channel layer 52 yields a two dimensional electron gas. The two dimensional electron gas conducts a controllable current from the source 58 to drain 60 in the HEMT. The HEMT may also include a spacer layer 56, formed of a Group III nitride such as aluminum nitride, between the channel 52 and barrier 54 layers to optimize device performance.

Figure 12:
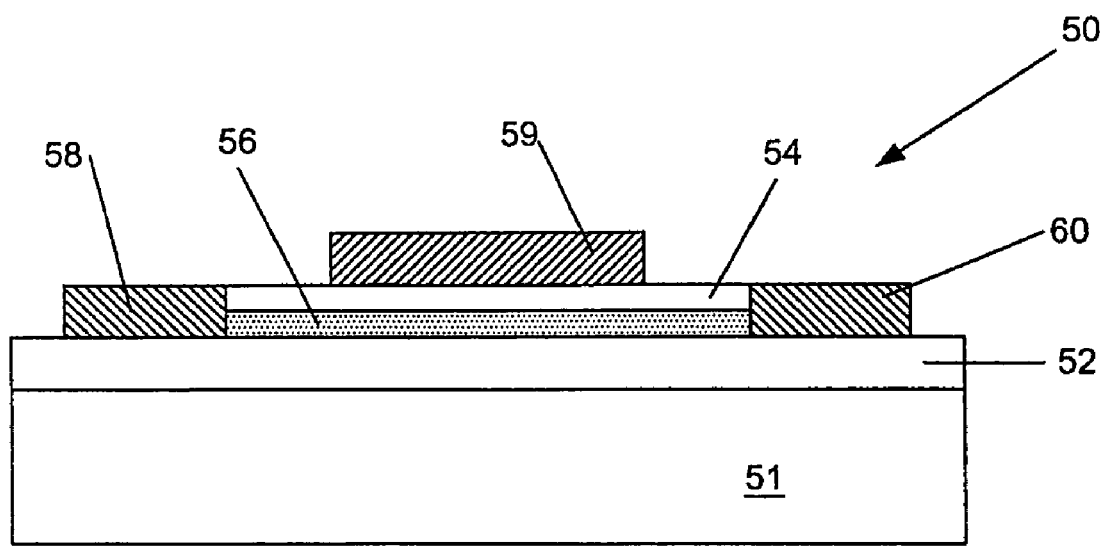

Certain embodiments of HEMTs may have various configurations for the source 58, gate 59 and drain 60 contacts. FIG. 12 illustrates one embodiment in which the source 58 and drain 60 contacts may be platinum deposits on the Group III nitride channel layer 52, and the gate contact 59 is a platinum deposit on the Group III nitride barrier layer 54. In an HEMT formed with a barrier layer 54 of AlGaN on a GaN channel layer 52 on a silicon carbide substrate 51, the gate contact 59 may be a platinum contact placed on the AlGaN layer because platinum exhibits rectifying behavior on AlGaN. The source and drain contacts 58, 60 of this embodiment may then be deposits of platinum that extend all the way to the GaN layer because platinum is ohmic on GaN.

Figure 13:
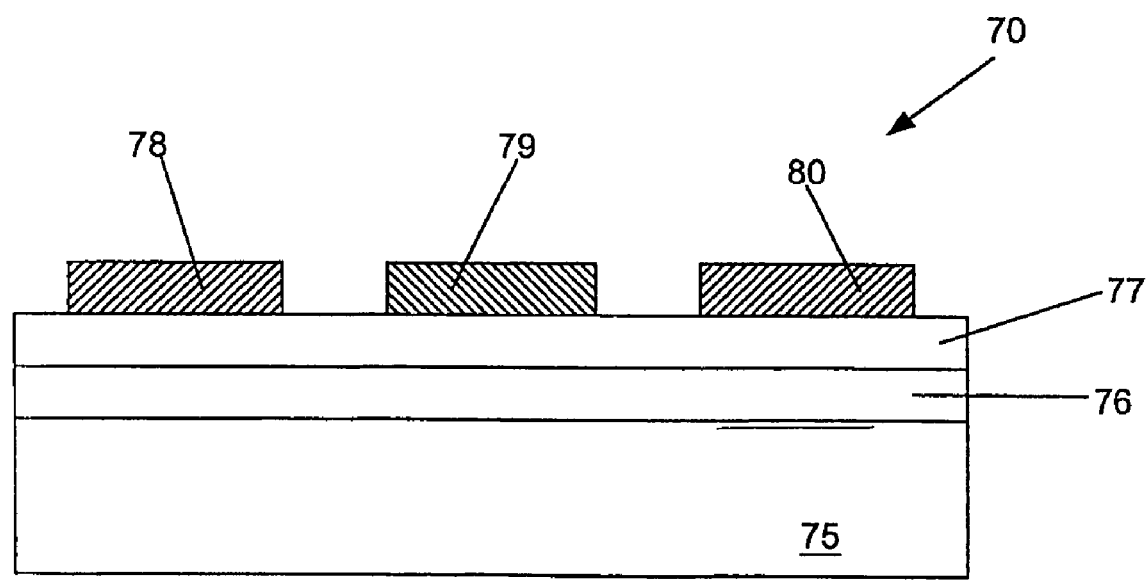

Other materials and positions for the source, gate, and drain contacts are possible in a transistor, depending upon the application at hand. FIG. 13 illustrates another embodiment in which the source 78, gate 79, and drain 80 contacts are made of appropriate materials that are ohmic or rectifying as needed on the barrier layer 77 of an HEMT 70. FIG. 13, therefore, shows an HEMT 70 formed with an AlGaN barrier layer 77 on a channel layer 76 of GaN on a silicon carbide substrate 75. The source 78, gate 79, and drain 80 contacts of FIG. 13 are made of materials that give the appropriate ohmic or rectifying current response on the AlGaN barrier layer 77. The gate contact 79 may be formed of titanium, platinum, chromium, alloys of tungsten and titanium, or platinum silicide and achieve a rectifying current response on the AlGaN barrier layer 77. The source and drain contacts 78, 80 may be formed of alloys of titanium, aluminum, and nickel and achieve the desired ohmic response on the AlGaN barrier layer 77. The invention herein, therefore, requires only that source and drain contacts be formed so that the source and drain contact material exhibits ohmic behavior when placed on an epitaxial layer made of a semiconductor material other than silicon carbide. Likewise, the gate contact must be formed of a contact material that exhibits rectifying behavior when placed on an epitaxial layer made of a semiconductor material other than silicon carbide.

The placement of contacts on a silicon carbide based transistor requires considerations other than simple conductivity. The contact must respond appropriately when a current is conducted across it in a controlled circuit, as discussed above. The contact must also be conducive to standard fabrication techniques that are compatible with the remaining portions of the device. The invention herein emphasizes these considerations with the additional advantage of placing contacts on a transistor that are made of appropriate materials serving as electrical conduits and etch stops in the fabrication of conductive vias. Accordingly, FIG. 2 shows a conductive etch stop material, which may be indium-tin-oxide ("ITO"), or preferably platinum, in the form of a contact 25 placed at a predetermined position on the uppermost surface 26 of the epitaxial layer 29. As shown in greater detail below, the contact 25 has physical qualities that enable it to serve as an endpoint of a conductive via through the device. By serving the dual purpose of electrical contact and etch stop, the contact 25 alleviates the need for an extra etch stop material being added to the manufacturing process.

Figure 3:
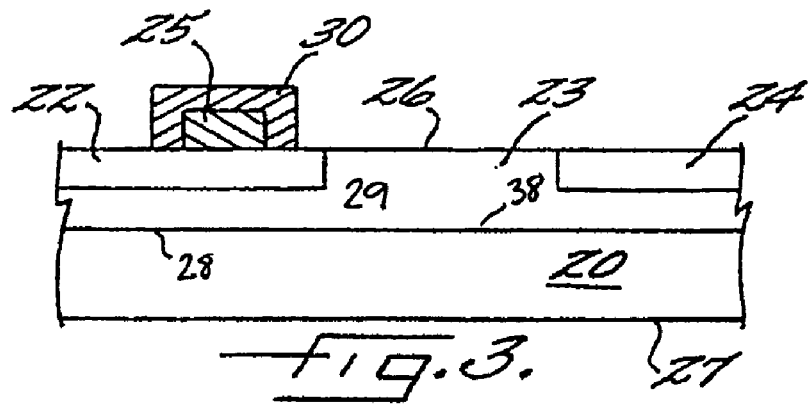

FIG. 3 illustrates that in order to provide a high quality contact for the devices utilizing an indium-tin-oxide contact 25, the contact 25 is typically further coated with a noble metal 30 which in preferred embodiments is typically gold. The noble metal 30 would not be necessary for devices utilizing a platinum contact as the etch stop.

At this point, one of the particular advantages of the invention can be highlighted: the use of conductive ITO, or platinum as the case may be, as the etch stop eliminates the need to add and remove another etch stop material before and after the etch step respectively. Instead, the ITO or platinum is simply incorporated into the device or circuit before the via is etched. Because the ITO or platinum etch stop does such double duty, fewer materials need be introduced into the process environment, and fewer process steps are required. As known those familiar with semiconductor manufacturing techniques, processes using fewer steps and fewer materials, yet producing the desired structures, are generally advantageous. Furthermore, eliminating a foreign etch stop material that would otherwise have to be both added and then removed, is particularly advantageous.

Figure 4:
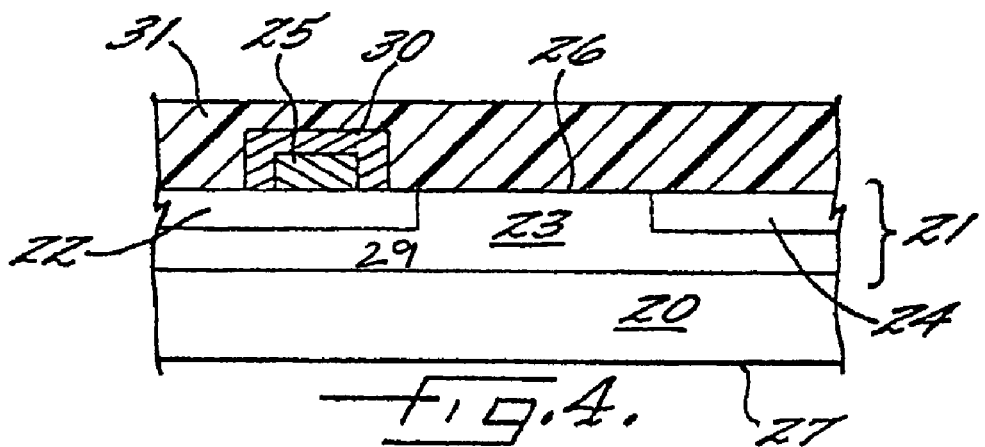

FIG. 4 illustrates that in preferred embodiments, the device, particularly the uppermost epitaxial layer and the source 22, the gate 23, and the drain 24 regions, are covered with a protective polymer layer 31 which in preferred embodiments is a polyimide. The polyimide layer 31 protects the device underneath, and provides a leveling effect for the precursor for appropriate handling in the following manufacturing steps.

Figure 5:
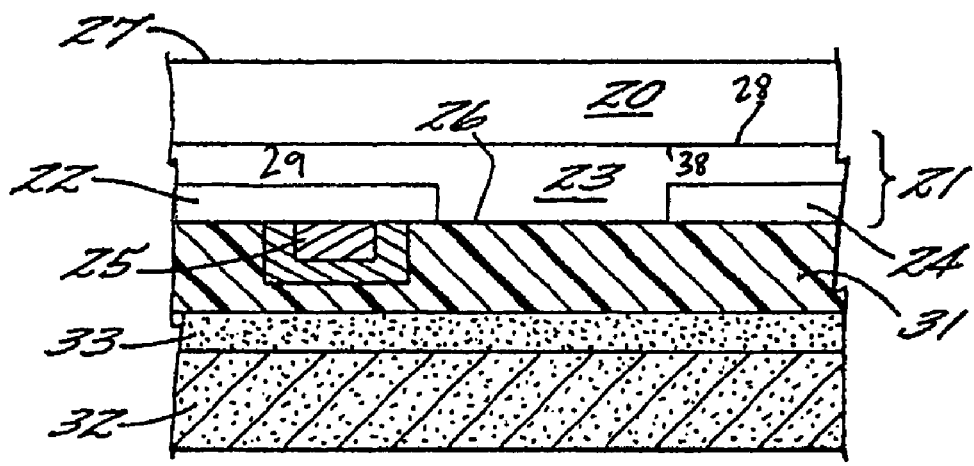

FIG. 5 illustrates that in a next step, the polymer-coated uppermost surface 26 of the epitaxial layer 29 is mounted on a platen 32. The platen 32 is preferably formed of silicon carbide, in this case for its mechanical and thermal properties rather than its electronic advantages. Typically, a mounting adhesive 33 is used to fix the polyimide coated surface 31 to the platen 32. The mounting adhesive can be any appropriate material that will keep the polyimide-coated device and substrate fixed to the silicon carbide platen 32 during the subsequent processing steps while both withstanding those steps and avoiding any interference with them. Such adhesives are generally well known in the art and will not be described in detail herein.

Figure 6:
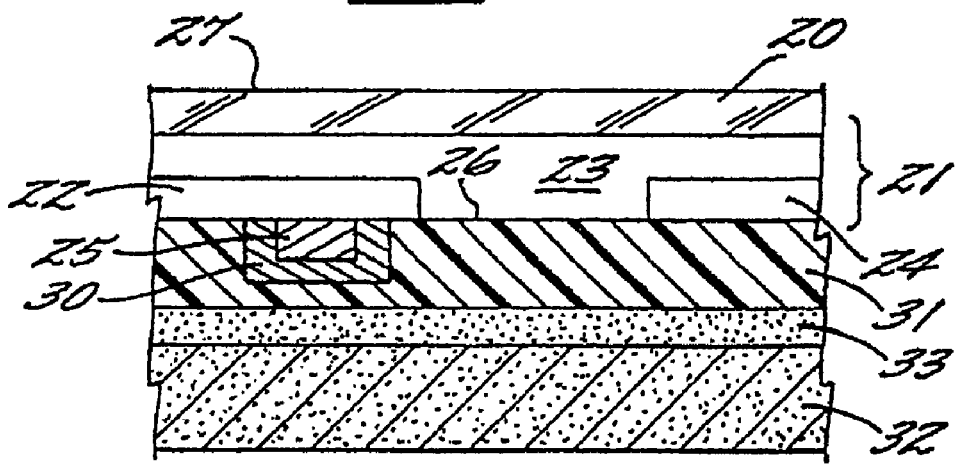

FIG. 6 illustrates that in the next step of the preferred method, the semiconductor substrate 20 is ground and polished until it is substantially transparent. The grinding and polishing are carried out for at least three reasons. First, because etching through silicon carbide is difficult under any circumstances, minimizing the thickness of the silicon carbide substrate 20 helps facilitate the overall etching process. Second, by grinding and polishing the substrate 20 until it is substantially transparent, an appropriate optical path can be defined from the first surface 27 of the substrate 20 to the metal contact 25 so that appropriate positions for the vias can be aligned and etched to the contact 25 in the desired manner, as described herein with respect to the remaining drawings. Third, the resulting thinner substrate (i.e., less mass) offers thermal advantages for the resulting device or MMIC.

According to the present invention, when etching a via the front side etch stop pads should be conductive so that the multiple layers forming the integrated circuit will be connected, thereby allowing the circuit to perform its desired function. Further, the etch mask on the backside of the sample is preferably transparent to permit optical alignment (including visual alignment) of the sample with the front side etch stop.

Figure 7:
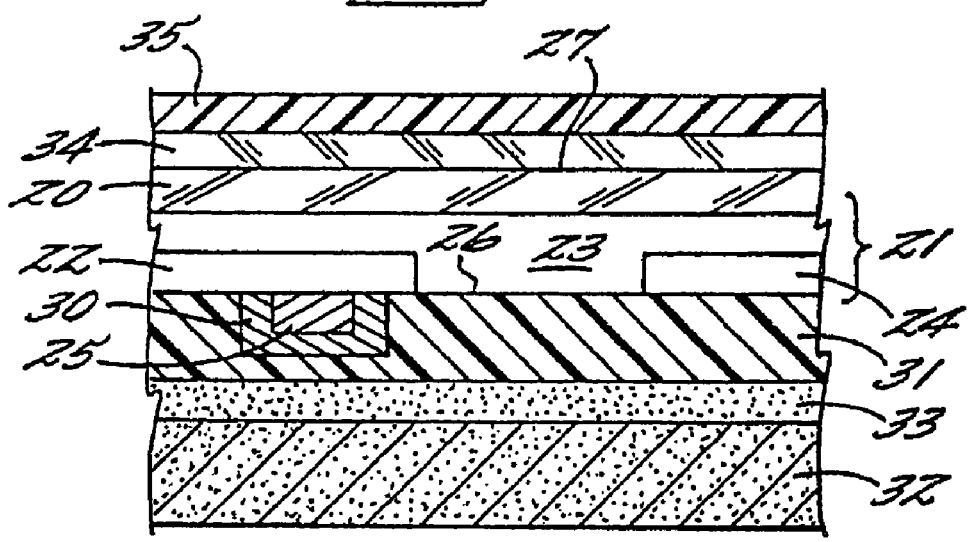

FIG. 7 illustrates that in the next steps of the preferred method of the invention, the first surface 27 of the substrate 20 is coated with a layer 34 of indium-tin-oxide (ITO). The ITO is selected and incorporated for at least two reasons. First, the ITO layer 34 can be formed to be transparent, so that the method of the invention can incorporate typical microlithography and masking techniques used in semiconductor design and manufacture. Second, and as discussed in the Experimental section to follow herein, the ITO provides a good masking material for SiC because the desired etchants discriminate as between SiC and ITO in a manner that is both desired and necessary during the etching process.

In another embodiment, the layer 34 on the substrate's first surface 27 can comprise magnesium oxide (MgO), which offers the same advantages—selectivity and transparency—as ITO. As known to those familiar with MgO, it can be produced in a very dense form with a very high melting point (2800° C.).

The ITO layer 34 is then coated with an appropriate photoresist layer 35. Photoresist compounds are generally well known in the art and will not be otherwise discussed in detail herein, other than to note that an appropriate photoresist material should be compatible with deposition of the ITO layer 34 and should provide an appropriate level of definition when exposed and developed. The exposed photoresist layer 35 provides a guide for etching the ITO layer 34, the substrate 20, and the epitaxial layer 29.

Figure 8:
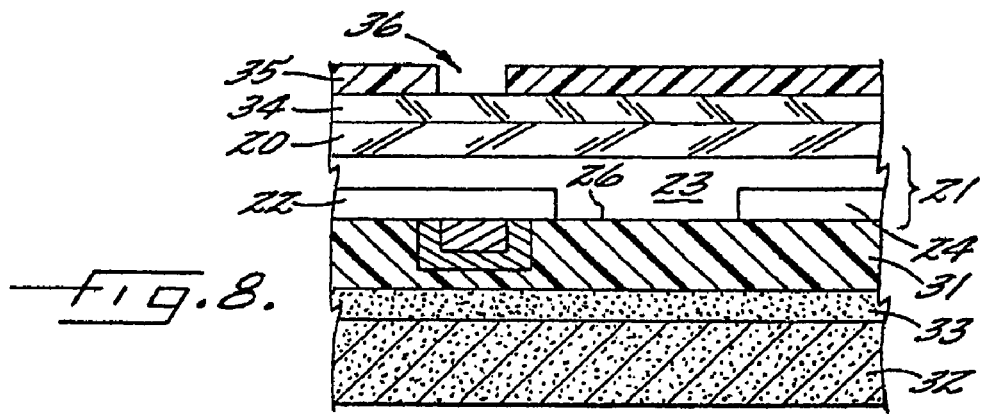
Figure 9:
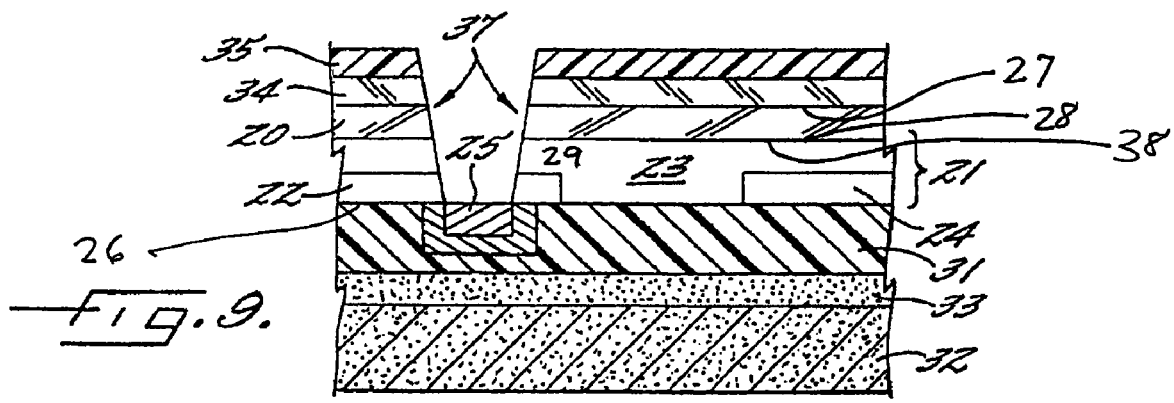

FIG. 8 illustrates the precursor structure after the photoresist 35 has been masked, exposed, and developed, steps which can otherwise be carried out in conventional fashion provided they are consistent with the remainder of the process and materials. Opening the photoresist forms a defined opening 36 in the photoresist layer 35 through which the ITO layer 34 can be appropriately opened and then, as illustrated in FIG. 9, the appropriate via 37 can be formed. In preferred embodiments of the invention, the ITO layer is etched with a reactive ion etch using with boron trichloride (BCl$_3$) chemistry.

As FIG. 9 illustrates, the invention herein is a method of fabricating a semiconductor device with a via that is formed by etching steps to provide a conductive path from the first surface 27 of the substrate to the source 22, gate 23, or drain 24 regions of the device. The conductive path eliminates the need for wire bonding when the semiconductor device is incorporated into an integrated circuit because the contacts are electrically accessible through the via. The semiconductor device with the conductive via is fabricated by forming at least one epitaxial layer 29 of a wide bandgap semiconductor material other than silicon carbide on a silicon carbide substrate 20. The substrate preferably has first and second surfaces on opposite sides, and the at least one epitaxial layer 29 comprises a lower surface 38 in contact with the second surface 28 of the silicon carbide substrate 20 and an uppermost surface 26 for fabricating semiconductor device components thereon. Source 22, gate 23, and drain 24 regions of the device are defined by placing respective contacts at predetermined positions on the uppermost surface of the epitaxial layer 29 or layers.

A mask is then applied to the first surface 27 of the silicon carbide substrate 20. The mask is aligned on the photoresist layer 35 to define points that will be opened by developing the photoresist layer using conventional means. Masking the first surface of the silicon carbide substrate defines predetermined locations for a plurality of conductive vias opposite from and aligned with the predetermined positions for the contacts connected to the source 22, gate 23, and drain 24 regions.

Next, a plurality of conductive vias are etched through the silicon carbide substrate 20 and through the epitaxial layer, or epitaxial layers 29, to provide conductive paths from the first surface of the silicon carbide substrate 27 to each respective contact on the source 22, gate 23, or drain 24 region.

The inventors herein have developed a series of steps to conveniently and accurately etch all of the layers necessary in fabricating semiconductor devices on a silicon carbide substrate.

First, the transparent ITO layer 34 is etched within the region defined by the mask with a first reactive ion etch. In one embodiment, the first reactive ion etch is carried out using boron trifluoride as the etchant.

The silicon carbide substrate 20 is etched next with an etchant that removes silicon carbide but does not remove the material other than silicon carbide forming the epitaxial layer 29 on the second surface 28 of the substrate 20. Etching of the silicon carbide, therefore, stops at an epitaxial layer 29 on the substrate 20. In one embodiment, the step of etching the silicon carbide substrate includes etching within the region defined by the mask with an inductively coupled plasma. The inductively coupled plasma etching of the silicon carbide substrate is typically carried out in fluorine chemistry using sulfur hexafluoride (SF$_6$) as the etchant.

Third, the epitaxial layer 29, or layers, are etched with an etchant that removes the material other than silicon carbide, forming the epitaxial layer 29, but does not remove the silicon carbide or the materials used to form source, gate, or drain contacts, so that etching the epitaxial layer 29 stops at each respective source, gate, and drain region. The step of etching the epitaxial layer, or layers, preferably includes etching within the region defined by the mask with a second reactive ion etch. In one embodiment, chlorine chemistry is used to etch the epitaxial layers in the reactive ion etch.

Upon completion of the etching process, the method herein includes grinding off the transparent layer 34 to ensure metal adhesion to the backside of the substrate when installing the overall device in a circuit. The first surface 27 of the silicon carbide substrate 20 is then subject to further inductively coupled plasma etching in a fluorine chemistry, after grinding off the transparent layer, to repair any damage to the substrate caused by grinding.

The steps of the etching process yield precursor products at certain points in the method described herein. The invention, therefore, includes circuit precursors at different levels of fabrication and etching. For example, one circuit precursor includes a polished silicon carbide substrate 20 having respective first and second surfaces 27 and 28, at least one Group III nitride epitaxial layer 29 on the second surface 28 of a silicon carbide substrate 20, an uppermost surface 38 of the epitaxial layer 29 for forming electrical contacts thereon, a semiconductor device 21 in the epitaxial layer 29, respective contacts, one of which is shown by example 25 on the uppermost surface 26 for defining source 22, gate 23, and drain 24 regions for a semiconductor device 21 in the epitaxial layer 29, a polymer coating covering the entire epitaxial layer 29 including the contacts, and a transparent layer 34 selected from the group consisting of indium-tin-oxide and magnesium oxide on the first surface of the polished transparent substrate.

A circuit precursor may include at least one via extending from the layer of photoresist 35 on the silicon carbide substrate 20, through the silicon carbide substrate, to the second surface 28 of the substrate under the epitaxial layers. Alternatively, a circuit precursor according to this invention may comprise at least one via extending through the silicon carbide substrate 20 and through the at least one epitaxial layer 29, from the first surface of the substrate all the way to the contacts, shown in the figures by example contact 25.

In a particularly advantageous step, the method of the invention incorporates the original conductive contact 25 as the etch stop. In one preferred embodiment, the conductive contact 25 is made of platinum for each respective source, gate and drain, which may serve as a useful etch stop in etching the epitaxial layers. The reactive ion etch utilizing chlorine chemistry, described above for etching the epitaxial layers, does not etch platinum. The platinum contact of the semiconductor device, therefore, serves as the etch stop. In this manner, the method of the invention avoids using additional steps—and (often just as importantly) additional materials—to add and then remove a separate etch stop. Again, it is to be understood that although the Figures illustrate only one via, such is for the purpose of clarifying the illustrations, and the invention is advantageously used for opening multiple vias.

Figure 10:
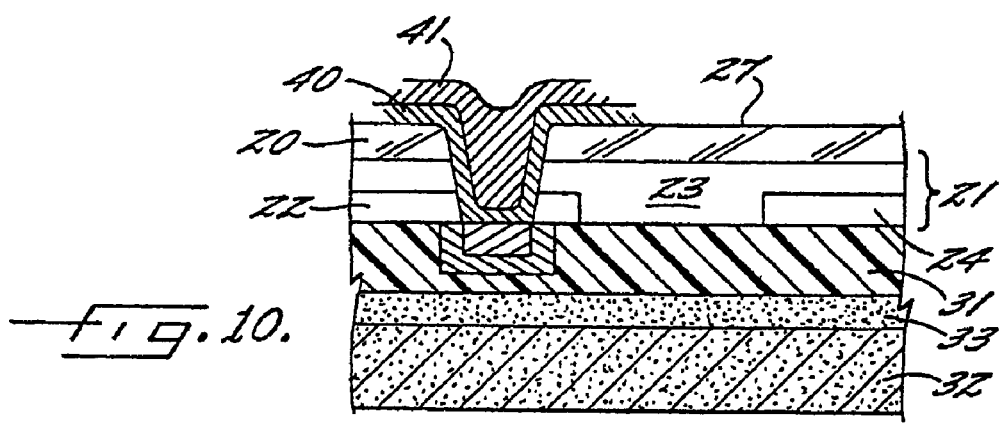
Figure 11:
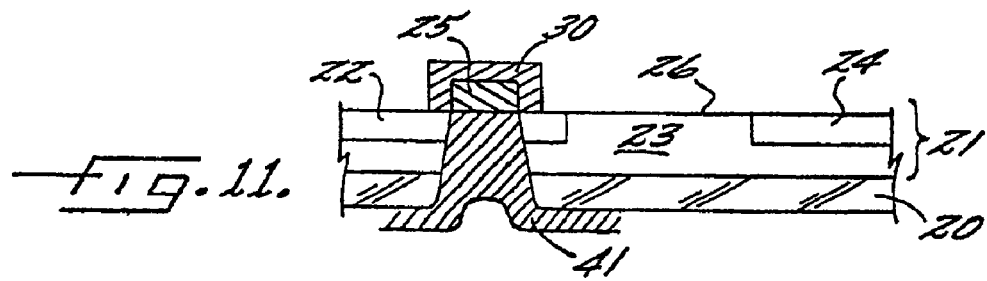

FIG. 10 illustrates that in preferred embodiments, the via is metallized to provide a conductive path from the first surface of the substrate to each respective source, gate, and drain contact. In a preferred embodiment, the via is first sputter-coated with three layers of metal: titanium, platinum, and gold ("Ti/Pt/Au"), in that order, along the floor and walls of the etched trench. This coating is designated as 40 in FIG. 10. The coating 40 is then electroplated with a noble metal 41, preferably gold, to form the complete contact from the first surface 27 of the substrate 20 through the substrate to the lower surface of the epitaxial layer 26, and more particularly to the contact 25 which is part of the device portion 21. In preferred embodiments, the photoresist and indium-tin-oxide layer 34 and the photoresist layer 35 are both removed prior to the step of sputter coating with the Ti/Pt/Au coating 40 and the electroplating with the gold 41. The device precursor is then removed from the platen 32 and the protective polyimide layer 31 is stripped to produce the resulting device illustrated in FIG. 11.

Figure 14:
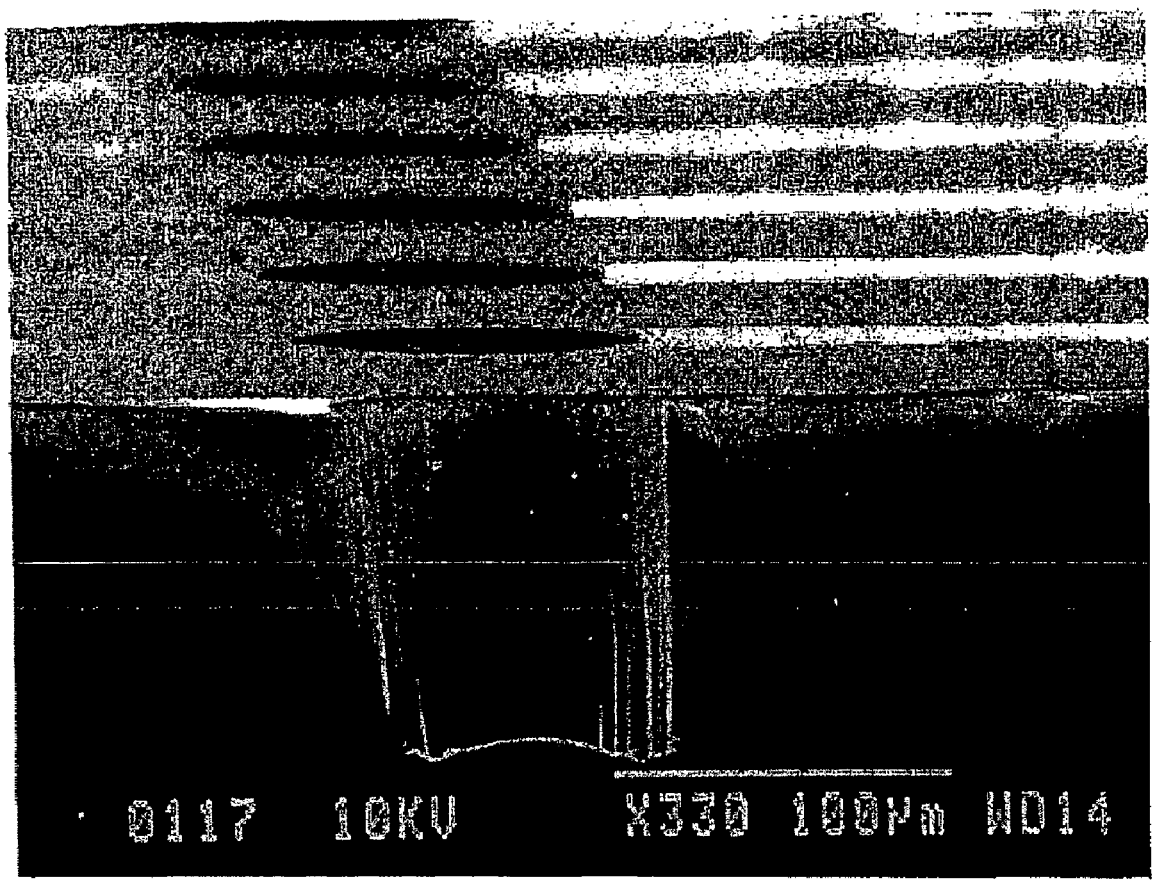
FIG. 14 is a scanning electron micrograph (SEM) of a via formed in a silicon carbide substrate according to the present invention.

FIG. 14 is an SEM micrograph of a 100 micron diameter via hole etched in a 4 mil (1000 mil=1 inch) silicon carbide wafer according to the present invention. Although FIGS. 1–13 are drawings and FIG. 14 is a photograph, by way of comparison, the top surface illustrated in FIG. 14 corresponds to the first surface 27 in the drawings. As understood by those of skill in this art, the ability to put vias of this diameter in silicon carbide substrates of this thickness, makes broadband, high frequency MMICS possible in desirable silicon carbide substrates.

The invention is a method of etching vias, typically (although not necessarily limited to) about 25 to 200 microns in diameter through a silicon carbide substrate, 100 to 200 microns thick. The inventive etch process yields an etch rate of between about 0.5 and 0.8 microns per minute (μ/min.), a selectivity to the etch mask of 150, and anisotropy of 90 to 99%.

The central issue of etching vias in silicon carbide is finding an etch process which etches silicon carbide—a material of high stability and high bond strength—a reasonable rate (e.g., 0.5 μ/min) while minimizing the erosion of the etch mask.

The invention satisfies these diametrically opposing requirements by the choice of mask material, plasma parameters, and chemistry.

In the invention, indium-tin-oxide ("ITO") is the preferred etch mask for vias in silicon carbide for several reasons. First, ITO is stable and does not etch in the fluorine chemistry that is most efficient and preferred for etching silicon carbide. Second, unlike other hard metal masks, ITO does not sputter at the ion energies that are sufficient to break silicon carbide bonds, and thus can etch silicon carbide. Third, ITO is also transparent, which allows the etch mask to be aligned through the wafer to the edge pads. Fourth, ITO may also be used for the etch stop, because it is conductive and a can serve as the material on which the etch stops.

As noted above, one of the best etch masking materials for vias etches in silicon carbide is Indium-Tin-Oxide (ITO). The ITO etch mask is patterned as follows. The wafer is first blanket coated with ITO, then with photoresist. The photoresist is exposed through a mask with UV light and the exposed areas harden, thus transferring the mask pattern onto the photoresist. The photoresist acts as a mask in the subsequent etch of the ITO in the chlorine chemistry, thus transferring the pattern of the photomask onto the ITO. The ITO then acts a mask in the subsequent etch of the silicon carbide vias in fluorine chemistry.

An inductively coupled plasma (ICP) is used in the invention to generate a high density $SF_6$ plasma to etch vias in silicon carbide for several reasons. First achieving a high etch rate in the silicon carbide while minimizing the erosion of the etch mask requires a high density and low energy plasma. The use of ICP is critical for this purpose because it allows a high density plasma to be generated, and it permits the independent control of plasma density by adjusting the coil power and ion energy by adjusting the chuck power. A high coil power (600–1500 W with about 800 W preferred) is selected to maximize plasma density.

An important point of the invention is the use of a chuck power in the ICP system that maximizes the etch rate of the silicon carbide while keeping the erosion of the ITO or MgO etch mask minimal. As the chuck power is increased in an ICP system, the etch rate of the silicon carbide increases; this increase, however, is much more drastic at low chuck powers than at high chuck powers. As the chuck power is increased the erosion rate of the ITO or MgO etch mask is minimal and does not increase initially; at higher chuck powers, however, it increases rapidly. Thus, the invention incorporates the recognition that a chuck power can be selected that on one hand maximizes SiC etch rate and on the other hand maximizes the difference in the etch rates of SiC and ITO etch mask. In preferred embodiments, this chuck power level is determined to be between about 1 to 2 watts of power per square centimeter ($Wcm^{-2}$) presently being preferred.

In preferred embodiments, the invention incorporates sulfur hexafluoride ($SF_6$) chemistry to etch vias in silicon carbide, because it is deemed to be the most efficient of the fluoride chemistries for such purpose. The invention does not use any gas additive, as it tends to slow down the etch rate of the silicon carbide and speeds up the mask erosion by sputtering. The invention uses $SF_6$ at a pressure of 1 to 5 milliTorr (mT), with about 3 mT being preferred. Similarly, the gas is supplied at a rate of between about 5 and 100 standard cubic centimeters per minute (sccm), with about 10 sccm being preferred.

In further investigations employing the use of $SF_6$, it was determined that $SF_6$ yielded a higher SiC to ITO mask selectivity (approximately 150:1) than $NF_3$ or $CF_4$ (approximately 70:1). As discussed above, conventional methods of etching SiC included the use of $NF_3$ or $SF_6$ diluted with Ar and $CF_4/O_2$. Upon investigation, however, the addition of Ar or $O_2$ to $SF_6$ or $NF_3$ reduced the etch rate in SiC and increased mask erosion due to the lower percentage of fluorine and greater ion bombardment. Thus, the use of $SF_6$ without additional gases is preferable in achieving the increased etch rate and high selectivity with respect to an ITO mask of the present invention.

The etch rate of a via can be increased by raising the temperature of the substrate or thin film applied thereon. Elevations in temperature may be achieved by halting the flow of helium to the backside of the sample, which serves to cool the sample. Otherwise, the backside pressure is maintained at between about 1 and 10 torr. The chemical reactions affecting the etch rate (e.g., breaking of molecular bonds) can also be increased by increasing the gas flow and chamber pressure.

An increase in the chemical reactions affecting the via etch results in an increased lateral etch and, thus, sidewall slope of the via. The increase in the chemical reactions also leads to an increase in the etch rate and erosion of the ITO mask. Further, spiking and surface imperfections may result from the enhanced chemical reactions.

As exemplified by the referenced cited in the Background, the equipment and processes used to generate inductively coupled plasmas are generally well-known and well-understood in this art. Accordingly, the techniques described herein can be carried out by those of ordinary skill in this art, and without undue experimentation.

Experimental:

In preferred embodiments, the present invention also comprises a method of dry etching a via in SiC using sulfur hexafluoride chemistry in an inductively coupled plasma (ICP). In a particular embodiment of the invention, the dry etching was conducted in a Model 790 ICP system manufactured by Plasma-Therm Incorporated.

In this system, the wafer is placed on a He-cooled chuck in the process chamber, the wafer is clamped and subsequently the process chamber is evacuated to $10^{-5}$ Torr with a turbo and mechanical pump. Five to twenty cubic centimeter per minute electronic grade sulfur hexafluoride is injected into the process chamber and a butterfly valve above the turbo pump is throttled to achieve the operating pressure of 2 to 5 mT. Subsequently, power is applied to generate a plasma. This system uses two radio frequency (RF) power sources. One is connected to the chuck and is used to control energies of ions reaching the substrate and is set between 1 to 2 $W/cm^2$. The second RF source is connected to a three turn inductor coil wrapped around the ceramic process chamber. The second RF source provides the main plasma generating power, controls plasma densities and is set between 800 and 1200 W.

Prior to etching the via, the SiC substrate is coated with ITO, then patterned with photoresist using standard photolithography. The ITO is then dry etched in chlorine chemistry in which the photoresist is the etch mask. Vias are subsequently etched in SiC in fluorine chemistry in which the ITO is the etch mask. The via dry etch process is highly anisotropic, with SiC etch rate of 0.5 to 0.8 micron/min, and selectivity to the etch mask of 100 to 150.

In the specification, there have been disclosed typical embodiments of the invention, and, although specific terms have been employed, they have been used in a generic and descriptive sense only and not for purposes of limitation, the scope of the invention being set forth in the following claims.

The invention claimed is:

1. A method of fabricating a silicon carbide based transistor that eliminates the need for electrical connection by wire bonding in an integrated circuit, the method comprising:

forming at least one epitaxial layer of a semiconductor material other than silicon carbide on a silicon carbide substrate, the substrate having first and second surfaces on opposite sides of the substrate, and the epitaxial layer comprising a lower surface in contact with the second surface of the silicon carbide substrate and an uppermost surface for fabricating semiconductor device components thereon;

forming source and drain contacts at predetermined positions on an epitaxial layer from material that exhibits ohmic behavior when placed on the epitaxial layer;

forming a gate contact at a predetermined position on an epitaxial layer from material that exhibits rectifying behavior when placed on the epitaxial layer;

masking the first surface of the silicon carbide substrate to define predetermined locations for a plurality of conductive vias opposite from the predetermined positions for the source, gate, and drain contacts;

etching a plurality of conductive vias through the silicon carbide substrate and through the epitaxial layer to provide conductive paths from the first surface of the silicon carbide substrate to each respective source, gate, and drain contact by etching the silicon carbide substrate with an etchant that removes silicon carbide but does not remove the semiconductor material of the epitaxial layer so that the etching removal of silicon carbide stops at the epitaxial layer and by thereafter etching the epitaxial layer with an etchant that removes the semiconductor material of the epitaxial layer but does not remove silicon carbide or the materials forming the source, gate, or drain contacts so that etching of the epitaxial layer stops at each respective source, gate, and drain contact.

2. A method of fabricating a transistor according to claim 1 wherein fabricating the source, gate, and drain contacts comprises depositing a platinum contact for each of the respective source, gate, and drain contacts.

3. A method according to claim 1 wherein the step of forming at least one epitaxial layer comprises forming a Group III nitride channel region of a transistor selected from the group consisting of a MESFET and an HEMT.

4. A method according to claim 1 wherein the step of forming at least one epitaxial layer comprises:

forming a channel layer of a Group III nitride semiconductor material on the silicon carbide substrate; and forming a barrier layer of a Group III nitride semiconductor material on the channel layer, wherein the barrier layer has a bandgap energy that is greater than the band gap energy of the channel layer, such that the layers provide a means for forming a high electron mobility transistor HEMT therein.

5. A method according to claim 4 wherein the step of forming at least one epitaxial layer further comprises the step of forming a spacer layer of aluminum nitride (AlN) on the channel layer before forming the barrier layer.

6. A method according to claim 4 wherein the step of forming the source, and drain contacts comprises depositing platinum on the Group III nitride channel layer and the step of forming the gate contact comprises depositing platinum on the Group III nitride barrier layer.

7. A method of fabricating a transistor according to claim 1 further comprising the steps of:
 covering the uppermost surface of the epitaxial layer and the source, gate, and drain contacts with a protective polymer layer; and
 mounting the polymer-coated uppermost surface on a platen.

8. A method of fabricating a transistor according to claim 7 wherein, following the step of mounting the polymer-coated uppermost surface on a platen, the step of masking the substrate comprises:
 grinding the first surface of the substrate;
 polishing the ground surface;
 placing a transparent layer selected from the group consisting of indium-tin-oxide and magnesium oxide on the polished surface;
 placing a photoresist on the transparent layer; and
 aligning a mask on the photoresist that develops the photoresist to open at points aligned with each respective source, gate, and drain contact.

9. A method of fabricating a transistor according to claim 8 further comprising the step of etching the transparent layer within the region defined by the mask with a first reactive ion etch.

10. A method of fabricating a transistor according to claim 9 wherein
 the step of etching the silicon carbide substrate comprises etching within the region defined by the mask with an inductively coupled plasma; and
 the step of etching the epitaxial layer comprises etching within the region defined by the mask with a second reactive ion etch.

11. A method of fabricating a transistor according to claim 10 wherein:
 the first reactive ion etch step is carried out on the transparent layer using boron trifluoride as the etchant;
 the inductively coupled plasma etching step is carried out using sulfur hexafluoride as the etchant; and
 the second reactive ion etch step is carried out using chlorine chemistry.

12. A method of fabricating a transistor according to claim 11 further comprising the steps of
 grinding off the transparent layer to ensure metal adhesion to the backside when installing the device in a circuit;
 etching the silicon carbide substrate in a fluorine chemistry after grinding off the transparent layer to repair any damage to the substrate caused by grinding.

13. A method of fabricating a transistor according to claim 12 further comprising the step of metallizing each via to provide a conductive path from the first surface of the substrate to each respective source, gate, and drain contact.

14. A method of fabricating a transistor according to claim 13 wherein the step of metallizing the via comprises:
 sputter coating the via with titanium, platinum and gold; and
 thereafter electroplating the sputtered layer with gold.

15. A method of fabricating a transistor according to claim 14 further comprising the step of demounting the uppermost surface from the platen.

16. A method of forming conductive paths to the electrical contacts of silicon carbide based transistors in an integrated circuit without the need for wire bonding, comprising:
 etching a via through a silicon carbide substrate of a transistor to each respective source, gate, and drain contact on an epitaxial layer of a transistor, in which the epitaxial layer is formed of a material other than silicon carbide, the source and drain contacts are formed from material that exhibits ohmic behavior when placed on the epitaxial layer, and the gate contact is formed of material that exhibits rectifying behavior when placed on the epitaxial layer, and wherein etching the via to the contacts comprises the steps of etching the silicon carbide substrate using an etchant that removes silicon carbide but does not remove the epitaxial layer so that the etching of the silicon carbide substrate stops at the epitaxial layer and thereafter etching the epitaxial layer using an etchant that removes the epitaxial layer but does not remove silicon carbide or the materials forming source, gate, and drain contacts so that etching the epitaxial layer stops at the source, gate, and drain contacts.

17. A method of fabricating a transistor according to claim 16 wherein
 the step of etching the silicon carbide substrate comprises placing a mask on the substrate to define regions on the substrate that are aligned with the contacts and etching within the regions defined by the mask with an inductively coupled plasma; and
 the step of etching the epitaxial layer comprises etching within the regions defined by the mask with a reactive ion etch.

18. A method of fabricating a transistor according to claim 17 wherein the inductively coupled plasma etching step is carried out using sulfur hexafluoride as the etchant, and the reactive ion etch step is carried out using chlorine chemistry.

19. A method of fabricating a transistor according to claim 16 further comprising the step of metallizing each via to provide a conductive path through the substrate to each respective source, gate, and drain contact.

* * * * *

UNITED STATES PATENT AND TRADEMARK OFFICE
CERTIFICATE OF CORRECTION

PATENT NO. : 7,125,786 B2
APPLICATION NO. : 11/067543
DATED : October 24, 2006
INVENTOR(S) : Zoltan Ring, Scott Sheppard and Helmut Hagleitner It is certified that error appears in the above-identified patent and that said Letters Patent is hereby corrected as shown below:

On the Title Pg, Item (63)
Replace the Related Application Data patent with "Continuation-in-part of application No. 10/249,448, filed on April 10, 2003, now U.S. Patent No. 6,946,739, which is a continuation of application No. 10/007,431, filed on November 8, 2001, now U.S. Patent No. 6,649,497, which is a continuation of application No. 09/546,821, filed on April 11, 2000, now U.S. Patent No. 6,475,889."

Replace col. 1, lines 5-8 with "This application is a continuation-in-part of application No. 10/249,448, filed on April 10, 2003, now U.S. Patent No. 6,946,739, which is a continuation of application No. 10/007,431, filed on November 8, 2001, now U.S. Patent No. 6,649,497, which is a continuation of application No. 09/546,821, filed on April 11, 2000, now U.S. Patent No. 6,475,889."

Signed and Sealed this

Thirteenth Day of July, 2010

David J. Kappos
*Director of the United States Patent and Trademark Office*